United States Patent
Tu et al.

(10) Patent No.: US 6,737,701 B1
(45) Date of Patent: May 18, 2004

(54) STRUCTURE AND METHOD FOR REDUCING CHARGE LOSS IN A MEMORY CELL

(75) Inventors: Amy C. Tu, San Jose, CA (US); Jean Yee-Mei Yang, Sunnyvale, CA (US); Yider Wu, Campbell, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/313,454

(22) Filed: Dec. 5, 2002

(51) Int. Cl.[7] .............................................. H01L 31/119
(52) U.S. Cl. ........................ 257/315; 257/315; 257/314
(58) Field of Search ................................ 257/315, 390, 257/330, 324; 365/185.22, 189.24, 185.27; 438/259, 276

(56) References Cited

U.S. PATENT DOCUMENTS 6,030,871 A  *  2/2000  Eitan ........................... 438/276
2002/0196665 A1  *  12/2002  Kim ......................... 365/185.22

* cited by examiner

*Primary Examiner*—David Nelms
*Assistant Examiner*—Thinh T Nguyen
(74) *Attorney, Agent, or Firm*—Farjami & Farjami LLP

(57) ABSTRACT

According to one exemplary embodiment, a structure comprises a first bit line and a second bit line. The structure further comprises a first memory cell situated over the first bit line, where the first memory cell comprises a first ONO stack segment, and where the first ONO stack segment is situated between the first bit line and a word line. The structure further comprises a second memory cell situated over the second bit line, where the second memory cell comprises a second ONO stack segment, where the second ONO stack segment is situated between the second bit line and the word line, and where the first ONO stack segment is separated from the second ONO stack segment by a gap. The first memory cell and the second memory cell may each be capable, for example, of storing two independent data bits.

20 Claims, 3 Drawing Sheets

STRUCTURE AND METHOD FOR REDUCING CHARGE LOSS IN A MEMORY CELL

TECHNICAL FIELD

The present invention is generally related to the field semiconductor devices. More particularly, the present invention is related to memory cells in semiconductor devices.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only-memory (EPROM), and electrically-erasable-programmable-read-only-memory (EEPROM) devices. EEPROM devices differ from other non-volatile memory devices in that they can be electrically programmed and erased. Flash memory devices are similar to EEPROM devices in that memory cells can be programmed and erased electrically. However, flash memory devices enable the erasing of all memory cells in the device using a single current pulse.

Product development efforts in flash memory devices have focused on increasing the programming speed, lowering programming and reading voltages, increasing data retention time, reducing cell erasure times, reducing cell dimensions, and optimizing dielectric materials used in memory cells. One important dielectric material for fabrication of the flash memory device is an Oxide-Nitride-Oxide (ONO) stack. During programming, electrical charge is transferred from the substrate to the silicon nitride layer in the ONO stack. Voltages are applied to the gate and drain creating vertical and lateral electric fields, which accelerate the electrons along the length of the channel. As the electrons move along the channel, some of them gain sufficient energy to jump over the potential barrier of the bottom oxide layer and become trapped and stored in the nitride layer.

The ONO stack can be utilized in memory cells capable of storing two independent bits in separate locations within the memory cell, such as Advanced Micro Devices' (AMD) MirrorBit™ memory cells, to achieve high-density flash memory devices. The MirrorBit™ memory cell includes a bit line, a word line, and an ONO stack, which function together to determine the location of a bit stored in memory. In a typical memory cell array utilizing memory cells capable of storing two independent data bits in separate locations within each memory cell, an ONO stack is formed and patterned over a substrate, which includes columns of bit lines. Word lines are formed over the patterned ONO stack and memory cells are formed at each intersection of a word line and a bit line, such that adjacent memory cells share the same word line.

In each memory cell discussed above, a right and a left bit can be stored in separate storage locations situated on the right and left sides, respectively, of the memory cell. The right and left bits are stored as electrical charges, which, as discussed above, are stored in the nitride layer of the ONO stack in each memory cell. However, since adjacent memory cells share a common ONO stack, electrical charge might undesirably travel in the nitride layer of the ONO stack between, for example, a right storage location in one memory cell and a left storage location in an adjacent memory cell. As a result, after a number of programming cycles, charge loss can occur in the memory cell, which can degrade the reliability of the memory cell. In current practice, the charge loss can occur after, for example, approximately 10,000 to 100,000 programming cycles.

Thus, there is a need in the art for a more reliable memory cell.

SUMMARY

The present invention is directed to structure and method for reducing charge loss in a memory cell. The present invention addresses and resolves the need in the an for a more reliable memory cell.

According to one exemplary embodiment, a structure comprises a first bit line and a second bit line. The structure further comprises a first memory cell situated over the first bit line, where the first memory cell comprises a first ONO stack segment, and where the first ONO stack segment is situated between the first bit line and a word line. The structure further comprises a second memory cell situated over the second bit line, where the second memory cell comprises a second ONO stack segment, where the second ONO stack segment is situated between the second bit line and the word line, and where the first ONO stack segment is separated from the second ONO stack segment by a gap.

According to this exemplary embodiment, the gap may prevent, for example, a charge from traveling between the first ONO stack segment and the second ONO stack segment. The gap may be formed by removing a portion of an ONO stack situated between the first bit line and the second bit line, for example. The first memory cell and the second memory cell may each be capable, for example, of storing two independent data bits. The first memory cell may be capable of storing two independent data bits in the first ONO stack segment and the second memory cell may be capable of storing two independent data bits in the second ONO stack segment, for example. The first and second memory cells may be, for example, non-volatile memory cells, such as flash memory cells. Other features and advantages of the present invention will become more readily apparent to those of ordinary skill in the art after reviewing the following detailed description and accompanying drawings.

DETAILED DESCRIPTION OF THE INVENTION

The present invention is directed to structure and method for reducing charge loss in a memory cell. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

The present invention involves an innovative process for preventing electrical charge from traveling between adjacent memory cells capable of storing two independent data bits in separate storage locations within each memory cell, such as AMD's MirrorBit™ memory cells. As will be discussed in detail below, by preventing electrical charge from traveling between adjacent memory cells, the present invention's innovative process advantageously achieves a memory cell having increased reliability. The present invention can be applied to any non-volatile memory, including flash memory.

Figure 1:
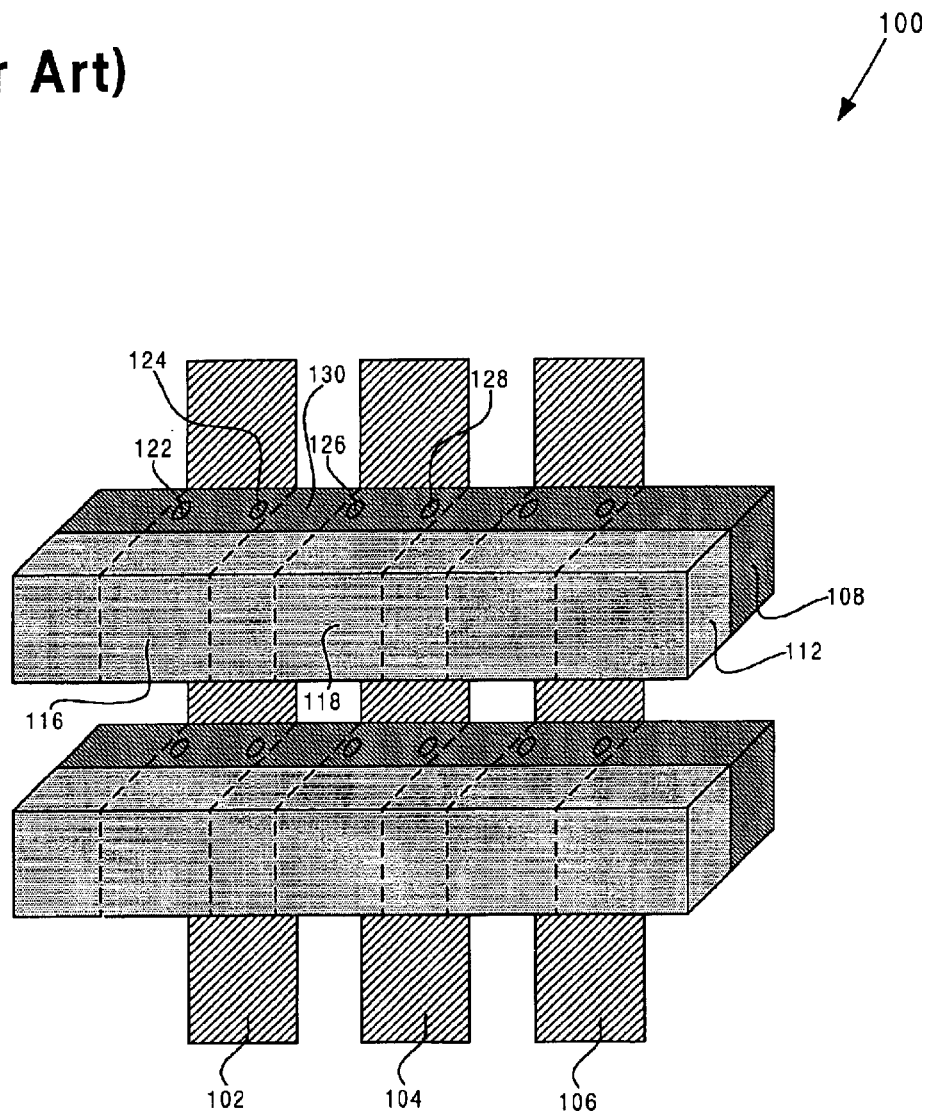
FIG. 1 illustrates a perspective view of a structure including conventional exemplary memory cells.

FIG. 1 shows a perspective view of an exemplary structure including conventional 20 exemplary memory cells. Structure 100 includes bit lines 102, 104, and 106, ONO (Oxide-Nitride-Oxide) stack 108, word line 112, and memory cells 116 and 118. Structure 100 can be, for example, part of non-volatile memory array, such as a flash memory array. Memory cell 116 includes storage locations 122 and 124 and memory cell 118 includes storage locations 126 and 128. It is noted that in FIG. 1, only memory cells 116 and 118, storage locations 122, 124, 126, and 128, ONO stack 108, and word line 112 are specifically discussed herein to preserve brevity.

As shown in FIG. 1, bit lines 102, 104, and 106 are situated in a substrate, which is not shown in FIG. 1. Also shown in FIG. 1, ONO stack 108 is situated over and aligned perpendicular to bit lines 102, 104, and 106. ONO stack 108 is a three-layer structure, which comprise a bottom layer of silicon oxide, a middle layer of silicon nitride, and a top layer of silicon oxide. ONO stack 108 can be formed by sequentially depositing a layer of silicon oxide and a layer of silicon nitride over the substrate (not shown in FIG. 1) utilizing a chemical vapor deposition (CVD) process to deposit each respective layer. A layer of silicon oxide can then be thermally grown on the silicon nitride layer to form an ONO layer. The ONO layer can be patterned by masking and etching the ONO layer in a manner known in the art to form ONO stack 108. Each of the three layers in the ONO stack, i.e. the top and bottom silicon oxide layers and the middle silicon nitride layer, can have a thickness of approximately 100.0 Angstroms.

Further shown in FIG. 1, word line 112 is situated over ONO stack 108. Word line 112 can comprise polycrystalline silicon (also referred to as polysilicon, or simply as "poly"). The polycrystalline silicon can be deposited in a CVD process. Also shown in FIG. 1, memory cell 116 includes storage locations 122 and 124, which are situated on left and right sides, respectively, of memory cell 116 in the silicon nitride layer of ONO stack 108. Further shown in FIG. 1, memory cell 118 includes storage locations 126 and 128, which are situated on left and right sides, respectively, of memory cell 118 in the silicon nitride layer of ONO stack 108. Memory cells 116 and 118 can be memory cells each capable of storing two independent data bits in separate storage locations, such as AMD's MirrorBit™ memory cells. Memory cell 116, for example, can store a data bit in storage location 122 and can store a second independent data bit in storage location 124. Also shown in FIG. 1, ONO stack segment 130 is situated between two-bit memory cells 116 and 118 in ONO stack 108. ONO stack segment 130 undesirably allows electrical charge to travel between storage location 124 in memory cell 116 and storage location 126 in memory cell 118.

Figure 2:
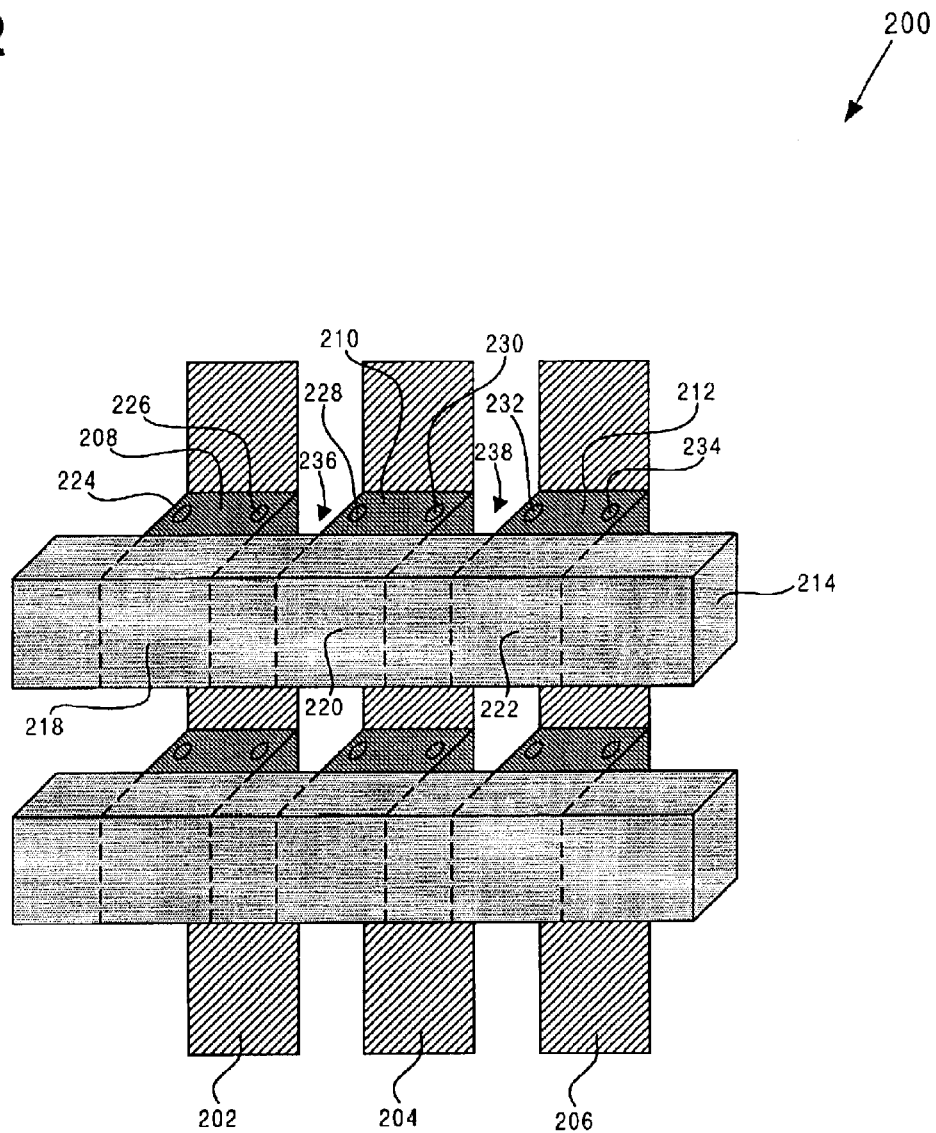
FIG. 2 illustrates a perspective view of a structure including exemplary memory cells, in accordance with one embodiment of the present invention.

FIG. 2 shows a perspective view of an exemplary structure including exemplary memory cells in accordance with one embodiment of the present invention. Structure 200 includes bit lines 202, 204, and 206, ONO stack segments 208, 210, and 212, word line 214, and two-bit memory cells 218, 220, and 222. In the present embodiment, structure 200 can be a flash memory array. However, in other embodiments, structure 200 may be a non-volatile memory array other than a flash memory array. It is noted that in FIG. 2, only word line 214, two-bit memory cells 218, 220, and 222, ONO stack segments 208, 210, and 212, storage locations 224, 226, 228, 230, 232, and 234, and gaps 236 and 238 are specifically discussed herein to preserve brevity.

As shown in FIG. 2, bit lines 202, 204, and 206 are situated in a substrate, which is not shown in FIG. 2, and correspond to bit lines 102, 104, and 106 in FIG. 1. Also shown in FIG. 2, ONO stack segments 208, 210, and 212 are situated over bit lines 202, 204, and 206, respectively. Prior to formation of ONO stack segments 208, 210, and 212, an ONO layer is formed over a substrate. The ONO layer can be formed in a similar manner as discussed above in FIG. 1. The ONO layer can be patterned by masking and etching the ONO layer to form an ONO structure, such as ONO stack 108 in FIG. 1.

In the present embodiment, ONO stack segments 208, 210, and 212 are then patterned by applying an additional mask to the ONO stack, such as ONO stack 108 in FIG. 1, and etching out portions of the ONO stack situated between bit lines 202, 204, and 206. An anisotropic etchant using a typical ONO etch chemistry as known in the art can be utilized to etch out the portions of the ONO stack situated between bit lines 202, 204, and 206 to form ONO stack segments 208, 210, and 212. As a result of the process of the present invention, adjacent ONO slack segments 208 and 210 are separated by gap 236 and adjacent ONO stack segments 210 and 212 are separated by gap 238.

Also shown in FIG. 2, word line 214 is situated over ONO stack segments 208, 210, and 212. Word line 214 can comprise a layer of poly, which can be deposited over ONO stack segments 208, 210, and 212 by a CVD process and patterned in a manner known in the art. The poly layer can have a thickness of approximately 2000.0 Angstroms, and is generally doped with an n-type dopant. Further shown in FIG. 2, memory cell 218 includes storage locations 224 and 226, which are situated on left and right sides, respectively, of two-bit memory cell 218 in the silicon nitride layer of ONO stack segment 208. Similarly, memory cell 220 includes storage locations 228 and 230, which are situated on left and right sides, respectively, of memory cell 220 in the silicon nitride layer of ONO stack segment 210. Additionally, memory cell 222 includes memory storage locations 232 and 234, which are situated on left and right sides, respectively, of memory cell 222 in the silicon nitride layer of ONO stack segment 212. Memory cells 218, 220, and 222 can be memory cells capable of storing two independent data bits in separate locations within the memory cell, such as AMD MirrorBit™ memory cells.

In present invention, ONO stack segments situated in adjacent memory cells are separated by a gap. For example, ONO stack segments 208 and 210 situated in adjacent memory cells 218 and 220, respectively, are separated by gap 236. Thus, by forming a gap, such as gap 236, between adjacent memory cells, such as memory cells 218 and 220, the present invention advantageously prevents electrical charge stored in a storage location in a memory cell from traveling to a storage location in an adjacent memory cell. For example, gap 236, prevents an electrical charge from traveling between storage location 226 situated on the right side of memory cell 218 and storage location 228 situated on the left side of memory cell 220 by gap 236. As a result, the present invention achieves a memory cell having reduced charge loss, which advantageously increases reliability of the memory cell.

In contrast, in conventional adjacent memory cells 116 and 118 in FIG. 1, electrical charge stored in memory storage location 126, situated on the left side of two-bit memory cell 118, can travel to memory storage location 124, situated on the right side of two-bit memory cell 116, and vice versa, via ONO stack segment 130. Consequently, after occurrence of a sufficient number of programming cycles, the reliability of memory cells 116 and 118 can be undesirably decreased.

Figure 3:
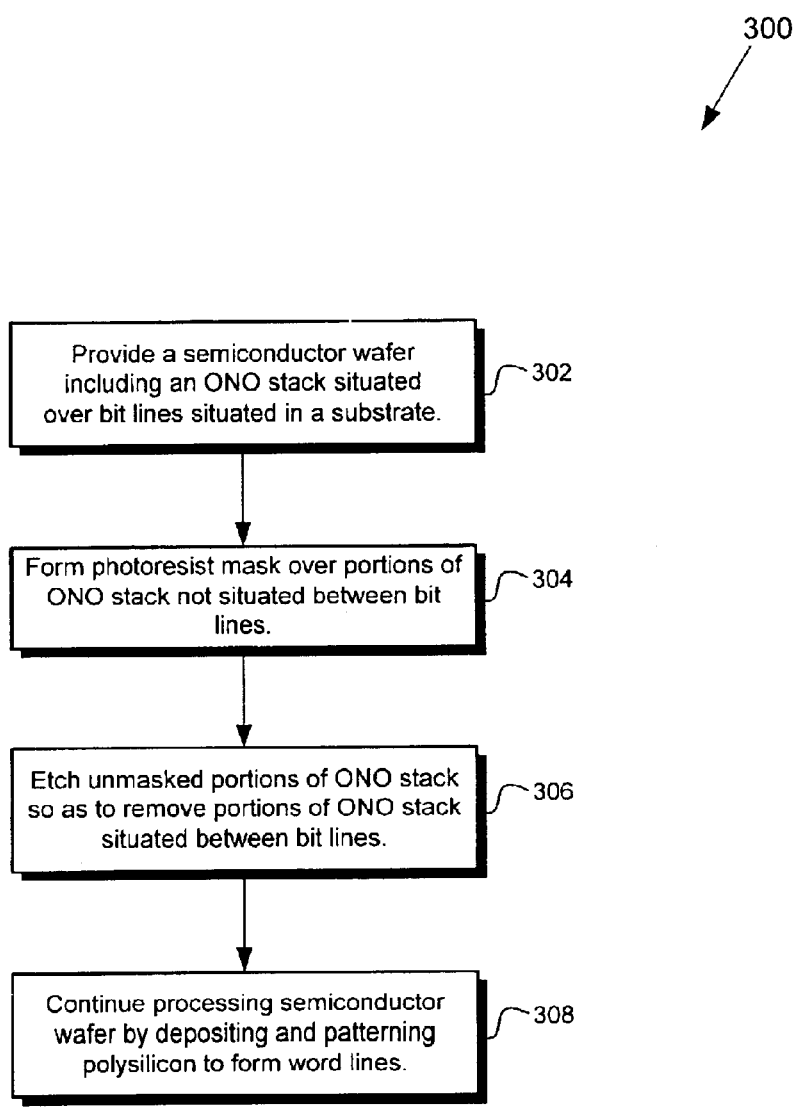
FIG. 3 is a flow chart corresponding to exemplary method steps according to one embodiment of the present invention.

FIG. 3 shows a flow chart illustrating an exemplary method according to an embodiment of the present invention. Certain details and features have been left out of flow chart 300 that are apparent to a person of ordinary skill in the art. For example, a step may consist of one or more substeps or may involve specialized equipment or materials, as known in the art.

At step 302, a semiconductor wafer is provided, which includes an ONO stack, such as ONO stack 108 in FIG. 1. The ONO stack is also situated over bit lines, such as bit lines 102, 104, and 106 in FIG. 1. At step 304, a photoresist mask is formed over portions of the ONO stack that are not situated between bit lines. Portions of the ONO stack that are situated between bit lines, such as ONO stack segment 130, which is situated between bit lines 102 and 103, are left unmasked. At step 306, the unmasked portions of the ONO stack are etched such that no portion of the ONO stack remains between the bit lines. For example, ONO stack 108 is etched to form ONO stack segments 208 and 210 in FIG. 2, which are separated by gap 236 resulting from removal of ONO stack segment 130 situated between bit lines 102 and 104. At step 308, processing of the semiconductor wafer continues by depositing and patterning polysilicon to form word lines, such as word line 214 in FIG. 2.

Thus, as discussed above, the present invention advantageously achieves reduced electrical charge loss in a memory cell by preventing electrical charge from traveling between adjacent memory cells. As a result, the present invention advantageously achieves a memory cell having increased reliability.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, structure and method for reducing charge loss in a memory cell have been described.

What is claimed is:

1. A structure comprising:
   a first bit line and a second bit line;
   a first memory cell situated over said first bit line, said first memory cell comprising a first ONO stack segment, said first ONO stack segment being situated between said first bit line and a word line;
   a second memory cell situated over said second bit line, said second memory cell comprising a second ONO stack segment, said second ONO stack segment being situated between said second bit line and said word line;
   wherein said first ONO stack segment is separated from said second ONO stack segment by a gap.

2. The structure of claim 1 wherein said gap prevents a charge from traveling between said first ONO stack segment and said second ONO stack segment.

3. The structure of claim 1 wherein said gap is formed by removing a third ONO slack segment situated between said first bit line and said second bit line.

4. The structure of claim 1 wherein each of said first memory cell and said second memory cell stores two data bits.

5. The structure of claim 1 wherein each of said first memory cell and said second memory cell comprises a non-volatile memory cell.

6. The structure of claim 4 wherein said first memory cell stores two data bits in said first ONO stack segment and said second memory cell stores two data bits in said second ONO stack segment.

7. The structure of claim 4 wherein each of said first memory cell and said second memory cell comprises a flash memory cell.

8. A method comprising steps of:
   patterning an ONO stack to form a first ONO stack segment and a second ONO stack segment, said first ONO stack segment being situated between a first bit line and a word line, said second ONO slack segment being situated between a second bit line and said word line;
   wherein said first ONO stack segment is separated from said second ONO segment by a gap.

9. The method of claim 8 wherein said step of patterning said ONO stack comprises steps of:
   forming a mask over a third ONO stack segment not situated between said first bit line and said second bit line;
   etching said ONO stack so as to remove said third ONO stack segment.

10. The method of claim 8 wherein said gap prevents a charge from traveling between said first ONO stack segment and said second ONO stack segment.

11. The method of claim 8 wherein said first ONO stack segment is situated in a first memory cell and said second ONO stack segment is situated in a second memory cell.

12. The method of claim 11 wherein each of said first memory cell and said second memory cell stores two data bits.

13. The method of claim 12 wherein said first memory cell stores two data bits in said first ONO stack segment and said second memory cell stores two data bits in said second ONO stack segment.

14. The method of claim 12 wherein each of said first memory cell and said second memory cell comprises a non-volatile memory cell.

15. The method of claim 14 wherein each of said first memory cell and said second memory cell comprises a flash memory cell.

16. A structure comprising a first bit line and a second bit line, a first memory cell situated over said first bit line, said first memory cell comprising a first ONO stack segment, said first ONO stack segment being situated between said first bit line and a word line, a second memory cell situated over said second bit line, said second memory cell comprising a second ONO stack segment, said second ONO stack segment being situated between said second bit line and said word line, said structure being characterized in that:

said first ONO stack segment is separated from said second ONO stack segment by a gap.

17. The structure of claim 16 wherein said gap prevents a charge from traveling between said first ONO stack segment and said second ONO stack segment.

18. The structure of claim 16 wherein said gap is formed by removing a third ONO stack segment situated between said first bit line and said second bit line.

19. The structure of claim 16 wherein each of said first memory cell and said second memory cell stores two data bits.

20. The structure of claim 19 wherein each of said first memory cell and said second memory cell comprises a flash memory cell.

* * * * *